(12) United States Patent
Wang et al.

(10) Patent No.: US 8,730,073 B1
(45) Date of Patent: May 20, 2014

(54) PIPELINED ANALOG-TO-DIGITAL CONVERTER WITH DEDICATED CLOCK CYCLE FOR QUANTIZATION

(71) Applicant: Broadcom Corporation, Irvine, CA (US)

(72) Inventors: Tao Wang, Costa Mesa, CA (US); Chun-Ying Chen, Irvine, CA (US); Jiangfeng Wu, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 13/738,557

(22) Filed: Jan. 10, 2013

Related U.S. Application Data

(60) Provisional application No. 61/738,666, filed on Dec. 18, 2012.

(51) Int. Cl.
*H03M 1/00* (2006.01)
(52) U.S. Cl.
USPC ............. 341/122; 326/93; 327/297; 375/354; 348/537; 341/155; 341/161; 341/172; 341/118
(58) Field of Classification Search
USPC ...................... 341/118–172; 348/537; 326/93; 327/297; 375/354
See application file for complete search history.

(56) References Cited

U.S. PATENT DOCUMENTS

| | | | |
|---|---|---|---|
| 6,249,240 B1 * | 6/2001 | Bellaouar | 341/172 |
| 6,614,374 B1 * | 9/2003 | Gustavsson et al. | 341/143 |
| 6,653,966 B1 * | 11/2003 | van der Goes et al. | 341/156 |
| 7,009,549 B1 * | 3/2006 | Corsi | 341/161 |
| 7,164,377 B2 * | 1/2007 | Pereira et al. | 341/150 |
| 7,187,318 B1 * | 3/2007 | Lee et al. | 341/161 |
| 7,852,252 B2 * | 12/2010 | Ge et al. | 341/155 |
| 8,106,809 B2 * | 1/2012 | Groenewold | 341/172 |
| 8,421,920 B2 * | 4/2013 | Funada | 348/537 |
| 8,595,539 B2 * | 11/2013 | Funada | 713/500 |

OTHER PUBLICATIONS

Ali, A.M.A., et al., "A 14-bit 125 MS/s IF/RF sampling pipelined ADC with 100 dB SFDR and 50 fs jitter," IEEE J. Solid-State Circuits, 41(8):1846-1855 (Aug. 2006).
Ali, A.M.A., et al., "A 16-bit 250-MS/s IF sampling pipelined ADC with background calibration," IEEE J. Solid-State Circuits, 45(12):2602-2612 (Dec. 2010).
Chang, D.-Y., "Design technique for a pipelined ADC without using a front-end sample-and-hold amplifier," IEEE Trans. Circuits Syst. I, Reg. Papers, 51:2123-2132 (2004).

(Continued)

*Primary Examiner* — Lam T Mai
(74) *Attorney, Agent, or Firm* — Nathan O. Greene; Brinks Gilson & Lione

(57) ABSTRACT

A method for digitizing an analog signal through a pipelined analog-to-digital converter (ADC) may include pipelining a sample sub-stage, a quantization sub-stage and an amplification sub-stage to an ADC lane. Within a first of multiple pipelined stages, clock phases may be assigned to the ADC lane, including a sample clock phase, a quantization clock phase, and an amplification clock phase such that the quantization clock phase is non-overlapping with the sample clock phase and the amplification clock phase. The non-overlapping feature may be facilitated by generating multiple reference clock phases for the sub-stages of multiple ADC lanes, and interleaving assignment of the sample clock phase, the quantization clock phase, and the amplification clock phase to the reference clock phases among the multiple lanes.

20 Claims, 8 Drawing Sheets

(56) References Cited

OTHER PUBLICATIONS

Devarajan, S., et al., "A 16-bit, 125 ms/s, 385 mW, 78.7 dB SNR CMOS pipeline ADC," IEEE J. Solid-State Circuits, 44(12):3305-3313 (Dec. 2009).

Li, J., et al., "A 1.8-V 22-mW 10-bit 30 MS/s pipelined CMOS ADC for low-power subsampling applications," IEEE J. Solid-State Circuits, 43(2):321-329 (Feb. 2008).

Maxim Integrated, "Understanding Pipelined ADCs," http://www.maximintegrated.com/app-notes/index.mvp/id/1023, 5 pages (Oct. 2001).

Wen, X., et al., "A 12b 60MS/s SHA-less opamp-sharing pipeline A/D with switch-embedded dual input OTAs," IEEE ISCAS, pp. 802-805 (May 2012).

Wen, X., et al., "A 30mW 10b 250MS/s dual channel SHA-less pipeline ADC in 0.18μm CMOS," IEEE MWSCAS, pp. 1004-1007 (May 2012).

* cited by examiner

PIPELINED ANALOG-TO-DIGITAL CONVERTER WITH DEDICATED CLOCK CYCLE FOR QUANTIZATION

CROSS REFERENCE TO RELATED APPLICATIONS

This application claims the benefit of priority from U.S. Provisional Application No. 61/738,666, filed Dec. 18, 2012, which is incorporated herein by reference.

TECHNICAL FIELD

This disclosure relates to analog-to-digital converters. In particular, this disclosure relates to a pipelined analog-to-digital converter (ADC) in which a dedicated clock cycle is provided for quantization, facilitating the elimination of a sample and hold amplifier (SHA) stage.

BACKGROUND

Rapid advances in electronics and communications technologies, driven by consumer demand, have resulted in the widespread adoption of data-driven devices, including those for handling high-speed data transfer. The data transfer process may include a analog-to-digital converter (ADC) to generate digital data from an analog signal. Improvements in ADCs will continue to extend the capabilities of data-driven devices.

BRIEF DESCRIPTION OF THE DRAWINGS

The systems and methods may be better understood with reference to the following drawings and description. In the figures, like reference numerals designate corresponding parts throughout the different views.

DETAILED DESCRIPTION

The discussion below refers to adjusting timing provided to phases of operation within a pipelined analog-to-digital converter (ADC) stage so that a quantization phase has additional time to operate. The ADC may perform the quantization on a sampled input analog signal before the ADC performs residue amplification as part of generating a multiple bit output value for the sample analog signal.

In one example, the disclosure further relates to pipelining a sample sub-stage, a quantization sub-stage, and an amplification sub-stage in an analog-to-digital converter (ADC) lane of an ADC. Clock phases may be assigned to the ADC lane that include a sample clock phase, a quantization clock phase, and an amplification clock phase such that the quantization clock phase is non-overlapping with the sample clock phase and the amplification clock phase. Such assignments may provide a dedicated clock cycle for the quantization sub-stage so that, as operation of the various phases are interleaved over multiple lanes, each quantization sub-stage does not overlap with either a previous sample sub-stage of a lane or a subsequent amplification sub-stage of the lane. Providing this additional time for quantization means that a sample and hold amplifier (SHA) circuit is not needed, although one may nevertheless be provided, to hold the sampled voltage long enough to complete quantization of the signal before amplification can begin. Eliminating the SHA has power, cost, circuit layout space, and other benefits.

The disclosed pipelined ADC design facilitates battery-mode operation of a full-band capture system, by achieving significantly less power dissipation than an ADC that includes a SHA. For example, the majority of power may traditionally be consumed in the SHA stage of a high-speed wide-band ADC. Further improvements may also be realized because the SHA stage may also degrade the system performance, in particular introducing noise and causing input signal distortion.

Figure 1:
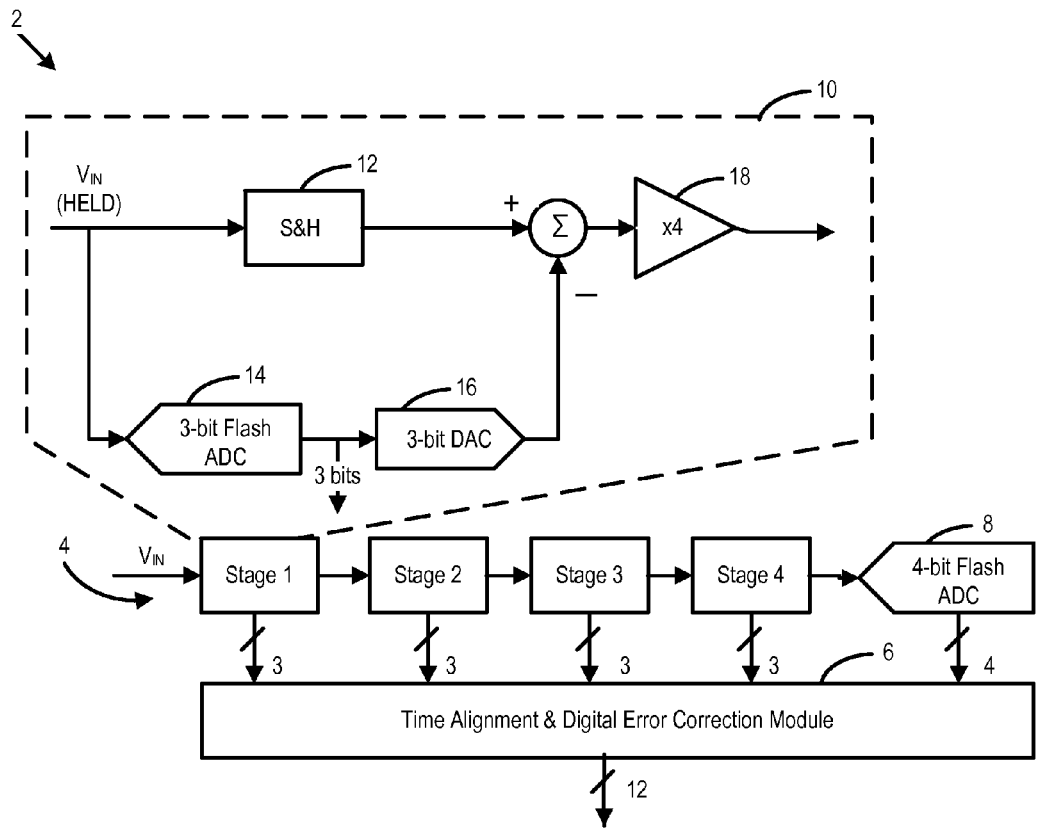
FIG. 1 is a block diagram of an exemplary conventional pipelined analog-to-digital converter (ADC).

FIG. 1 is a block diagram of an exemplary conventional pipelined analog-to-digital converter (ADC) 2. The pipelined ADC 2 includes a series of stages 4, in this case four stages, a time alignment and digital error correction module 6 and a 4-bit flash ADC 8. A first stage 10 of the four stages is enlarged, showing multiple sub-stages within the first stage 10.

With further reference to the first stage 10, the analog input, $V_{IN}$, may be first sampled and held steady by a sample-and-hold (S&H) circuit 12, which may be a sample and hold amplifier (SHA), while a 3-bit flash ADC 14 quantizes the sampled input to three bits, resulting in a 3-bit output from the flash ADC. The 3-bit output may then be fed to a 3-bit digital-to-analog converter (DAC) 16, which may be accurate up to 12 bits, and the analog output subtracted from the input ($V_{IN}$). The subtraction may result in a "residue," which may then be gained up by a factor of four by a residue amplifier 18 and fed to the next stage (e.g., Stage 2).

This gained-up residue may continue through the pipelined ADC 2, providing three bits per stage until the gained-up residue reaches the 4-bit flash ADC 8, which resolves the last four least significant (LSB) bits. Because the bits from each stage are determined at different points in time, all the bits corresponding to the sampled signal are time-aligned with shift registers before being fed to digital-error-correction logic, both residing in the time alignment and digital error correction module 6. When a stage finishes processing a sample, determining the bits, and passing the residue to the next stage, the stage can then start processing the next sample received from the preceding stage output. This pipelining action is the reason for the high throughput of a pipelined ADC.

Resolutions of the conventional pipelined ADC 2 may range from eight bits at the faster sample rates up to 16 bits at the lower rates. These resolutions and sampling rates cover a wide range of applications, including but not limited to: DDC (Digital Design Corporation) imaging, ultrasonic medical imaging, digital receivers, base stations, digital video (for example, High Definition Television (HDTV)), Digital Line Subscriber (xDSL), cable modems and fast Ethernet.

Figure 2:
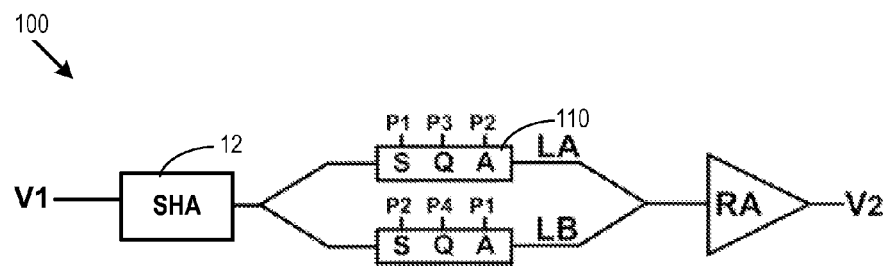
FIG. 2 is a block diagram of a first stage of a conventional double-sampling pipelined ADC that requires a sample and hold amplifier (SHA).

FIG. 2 is a block diagram of a first stage 100 of a conventional double-sampling (or Ping-Pong) pipelined analog-to-digital converter (ADC) that requires a sample and hold amplifier (SHA) 12. The "S" refers to input signal sampling. The "Q" refers to quantization of a sub-ADC input signal, Vin_sub, at the beginning instant of the quantization. The "A" refers to residue amplification by using a residue amplifier (RA). The values P1 through P4 may be reference clock phases to which sample clock phases, quantization clock phases and amplification clock phases are assigned so that digitization may occur across multiple lanes (LA, LB), resulting in an output voltage (V2) after processing the input voltage (V1). Each lane may include a sample (S), quantization (Q), and amplify (A) circuit 110. In one example, each clock phase referred to herein corresponds to an individual, discrete clock cycle.

Figure 3:
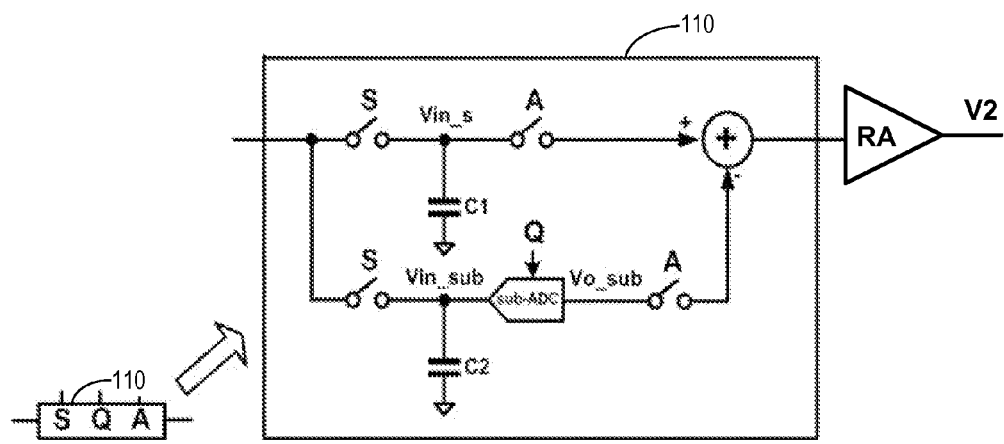
FIG. 3 is a block diagram of a sample (S), quantize (Q) and amplify (A) circuit that is the building block for the ADC in FIG. 2.
Figure 4:
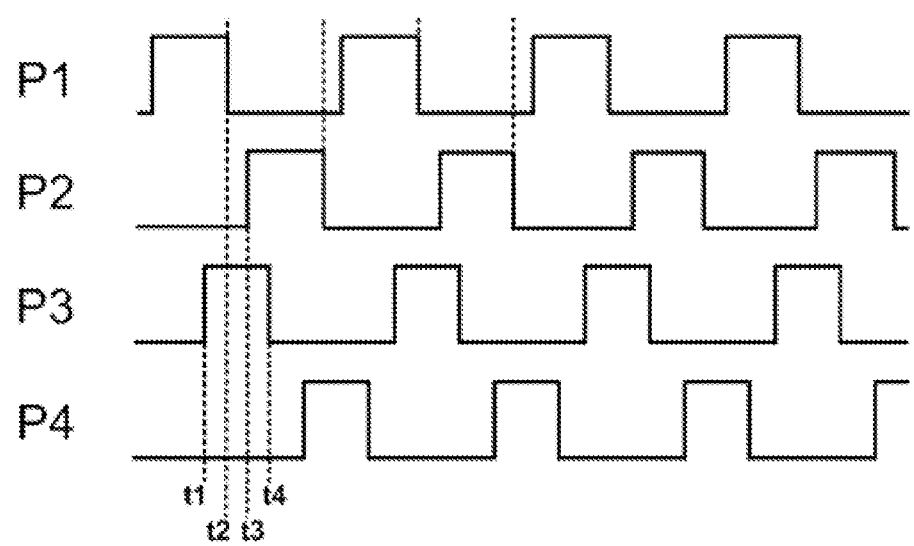
FIG. 4 is a timing chart providing timing of reference clock phases (P) of operation of FIG. 2.

FIG. 3 is a block diagram of a sample (S), quantization (Q) and amplify (A) circuit 110 that is the building block for the ADC 100 in FIG. 2. The sub-ADC performing the quantization (Q) in FIG. 3 may perform the same or similar function as the 3-bit flash ADC 14 and 3-bit DAC in the pipelined ADC 2 of FIG. 1. The RA amplifies the difference (or residue) between the sampled input signal Vin_s and the sub-ADC output, Vo_sub, which is Vin_sub+Quantization error Δ. Therefore, Q needs to be completed before A actually takes place. The switches S close to sample the input signal onto capacitors C1 and C2, which need to be held constant during quantization so that amplification can be performed on the proper differential value between Vin_sub and Vo_sub when switches A are closed.

Figure 6:
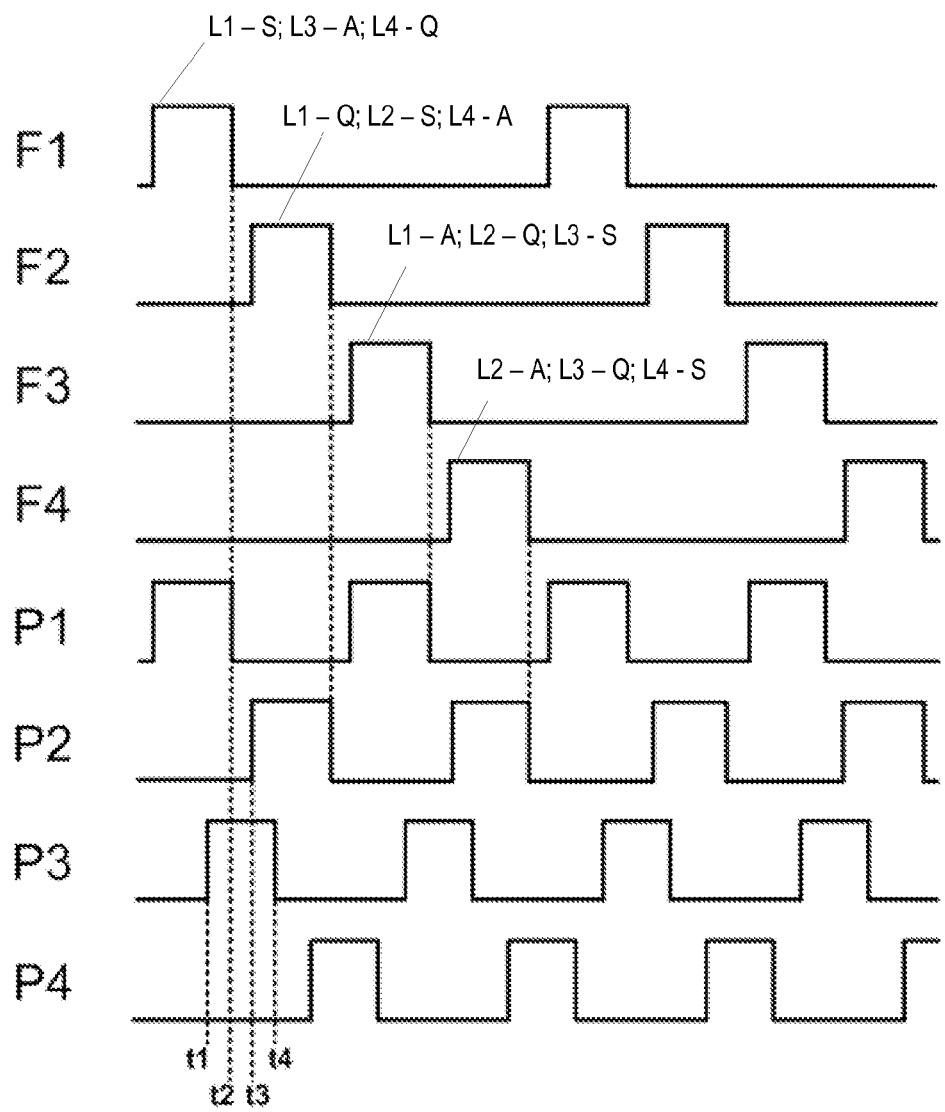
FIG. 6 is a timing chart providing a comparison of timing between prior art clock phases (P) of operation (FIG. 2) with the disclosed clock phases (F) of operation of the ADC of FIG. 5.

The timing of FIG. 2 is shown in the bottom half of FIG. 6 in the P phases, or clock reference phases to which the substages of each lane may be assigned. The upper lane (LA) of FIG. 2 performs S in phase P1 and A in phase P2. Q, therefore, must complete in the short interval between t2 and t3 (i.e., after S ends and before A begins). There is no separate or dedicated clock cycle for Q, although Q is assigned to reference clock phase P3 so that the sub-ADC in lane LA is being clocked and is operational once the sampling ends. Reference phase P3 may overlap with both reference clock phase P1 and reference clock phase P2. The short interval between t2 and t3 leaves little time for Q to complete, and places significant design constraints on the pipelined ADC 100.

The lower lane (LB) of FIG. 2 performs S in reference clock phase P2 and A in reference clock phase P1, causing the same severe time constraint on Q in lane LB as is present in lane LA. Q for the lane LB may be assigned to reference phase P4 so that the sub-ADC in lane LA is being clock and is operational once the sampling in reference clock phase P2 ends. Once the short time period between the end of S and the beginning of A is completed, the residue may be amplified in A. Accordingly, the residue amplifier (RA) operates in both clock phases P1 and P2, and is shared between both lanes (LA and LB) in a time-interleaved way. To share the RA, an integration capacitor of one lane is connected between a negative input and a positive output of an operational amplifier (op-amp) by closing two amplification switches, causing the op-amp to be occupied by the lane for which the switches are closed. The amplification switches of other lanes at this moment are open so as not to occupy the op-amp.

In the first lane (LA), the Q phase ideally begins at the falling edge of P1 (at t2) when the S phase is complete and Vin_s has been sampled onto the capacitor C1 and held constant, so that Vin_sub is the same as Vin_s. Q should be finished before the next rising edge of P2 (at t3) in time to provide a digitized output for when the A phase begins, so that the time for the following A phase does not need to be shortened.

In prior pipelined ADCs, high-speed applications (1 GHz or greater) such as in a cable television receiver, the time period t3-t2 may not be enough to adequately perform Q. To deal with the high speed and in an attempt to also eliminate the SHA 12, existing approaches try to increase t3-t2 by either (1) advancing in time t2 towards t1 or (2) delaying in time t3 towards t4 for purposes of providing additional quantization time.

In the first case, with a changing input signal without a SHA, Vin_s and Vin_sub (signal input seen by the sub-ADC at the quantization instant) may be different because their corresponding sampling instants are different, namely t2 and t1, respectively. This may result in over-range at the first stage output and increased signal-to-noise and distortion ratio (SNDR) degradation at high-input frequencies. An over-ranged output signal results in large distortion of the following stage and degrades the overall performance. "Over-ranged" refers to a power level of the input signal that goes beyond a dynamic range that may be resolved by the ADC.

In the second case, the time for A is reduced by an amount t4-t3, resulting in a high speed requirement for the RA, which may result in more chip space and higher power consumption.

Figure 5:
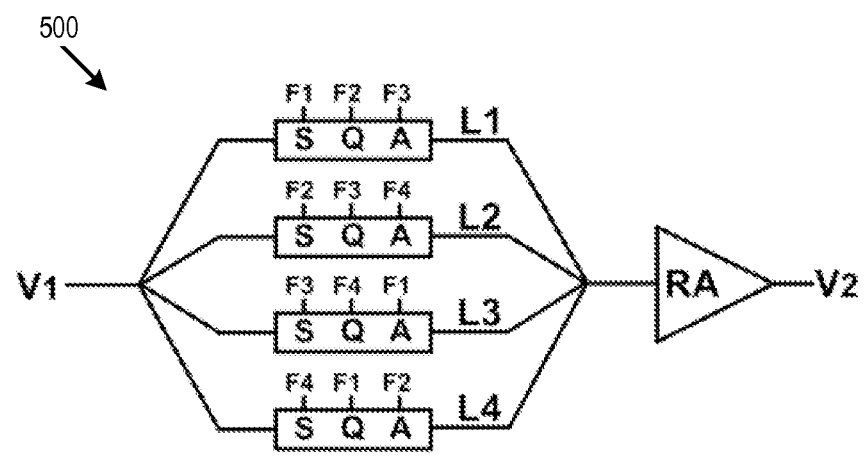
FIG. 5 is a block diagram of a first stage of an exemplary improved pipelined ADC with interleaved clock phases that provides a dedicated clock phase for quantization, which eliminates the need for a SHA.

FIG. 5 is a block diagram of an example improved first stage 500 of an ADC. The first stage 500 uses interleaved clock phases that provides a dedicated clock phase for quantization, which eliminates need for the SHA 12. To distinguish the above discussion, the multiple lanes are referred to as L1, L2, L3 and L4, showing just by way of example a four-lane implementation, and the reference clock phases are referred to as F1, F2, F3 and F4. Other combinations of lanes and reference clock phases may be used, including three lanes/phases, five lanes/phases and so on. FIG. 6 also shows the new timing in the above half of the timing chart showing phases F1 through F4, to which the below discussion will make reference.

In the disclosed example of four lanes and four reference clock phases, the first lane (L1) performs S in clock phase F1, Q in clock phase F2 and A in clock phase F3. At the falling edge of F1 (at t2), the input signal is sampled onto capacitors C1 and C2 and then held constant. Vin_s and Vin_sub should be the same at this point, eliminating over-range issues due to sampling different Vin_s and Vin_sub. At the rising edge of F2, performance of Q begins and the time allocated to Q is the whole F2 clock phase, e.g., an entire clock cycle, compared to the non-overlapping time t3-t2, or a small fraction of time t4-t1, corresponding to a portion of a clock cycle, in the case of FIG. 1. The speed and power requirements of the sub-ADC are therefore greatly relaxed, but the ADC is still able to operate at extremely fast speeds due to the multiple lanes provided. At the rising edge of clock phase F3, A begins and the allocated time for A is not shortened compared to the approach in FIG. 1 and bottom half of FIG. 6.

Accordingly, an additional dedicated phase in each lane for quantization (Q) may be inserted between the S phase for sampling and the A phase for performing amplification. The residue amplification (A) is therefore delayed, coming after a full phase for Q as opposed to following a fraction of a clock phase, and is referred to as delayed residue amplification (DRA). Because the two capacitors C1 and C2 in FIG. 3 sample at the same time and Vin_s and Vin_sub are the same as quantization begins, there is no need for a sample and hold amplifier (SHA) stage. The SHA-free operation may be made possible by the DRA, which greatly reduces the speed and power requirements of the sub-ADC, saves a significant amount of the total ADC power, improves ADC noise and distortion performance, and reduces the chip area.

With further reference to FIGS. 5-6, the operations of the other lanes (L2, L3, L4) are similar to that of lane L1, except a different timing operation is used such that the sample clock phase, quantization clock phase, and amplification clock phase are differently assigned to the lanes. For example, the phases may be shifted one lane to the next, in order to interleave operation of the four reference clock phases and still share operation of the residue amplifier (RA). Any of the reference clock phases may be mapped to a sample clock phase, a quantization clock phase, or an amplification clock phase in any particular lane. In the example of FIG. 3, for example, clock phase F1 is assigned to S in lane 1, A in lane 3 and Q in lane 4. F1 is unassigned in lane 2. Table 1 provides an example of how the lanes and reference clock phases may be interleaved by appropriately assigning the sample clock, quantize clock and amplification clock phases to the reference clock phases F1-F4 for four lanes/phases.

TABLE 1

|    | F1 | F2 | F3 | F4 | F1 | F2 | F3 | F4 | F1 | F2 | F3 | F4 |
|----|----|----|----|----|----|----|----|----|----|----|----|----|
| L1 | S  | Q  | A  |    | S  | Q  | A  |    | S  | Q  | A  |    |
| L2 |    | S  | Q  | A  |    | S  | Q  | A  |    | S  | Q  | A  |
| L3 | A  |    | S  | Q  | A  |    | S  | Q  | A  |    | S  | Q  |
| L4 | Q  | A  |    | S  | Q  | A  |    | S  | Q  | A  |    | S  |

Table 2 provides an additional example of interleaved timing where only three lanes (L1, L2, L3) and three reference phases (F1, F2, F3) are used.

TABLE 2

|    | F1 | F2 | F3 | F1 | F2 | F3 |
|----|----|----|----|----|----|----|
| L1 | S  | Q  | A  | S  | Q  | A  |
| L2 | A  | S  | Q  | A  | S  | Q  |
| L3 | Q  | A  | S  | Q  | A  | S  |

Each ADC lane of an ADC may require three clock phases for S, Q and A. If there are more than three reference clock phases, however, some of the reference clock phases may be combined to increase the time for quantizatoin (Q) and/or for amplificaiton (A). Table 3 provides another example of a timing scheme that uses four reference clock phases across four lanes to increase the time allocated for Q. For lane L1, the time allocated for Q (in bold) is F23=F2+F3. In one clock cycle of F23, the rising edge of F23 is the same as F2's rising edge, rs2, and the falling edge of F23 is the same as F3's falling edge, fl3, which is right after rs2. Four extra phases (F23, F34, F41, and F12) may be needed for Q of the four lanes, L1, L2, L3 and L4, respectively.

TABLE 3

|    | F1 | F2 | F3 | F4 | F1 | F2 | F3 | F4 | F1 | F2 | F3 | F4 |
|----|----|----|----|----|----|----|----|----|----|----|----|----|
| L1 | S  | Q | Q | A  | S  | Q | Q | A  | S  | Q | Q | A  |
| L2 | A  | S  | Q | Q | A  | S  | Q | Q | A  | S  | Q | Q |
| L3 | Q | A  | S  | Q | Q | A  | S  | Q | Q | A  | S  | Q |
| L4 | Q | Q | A  | S  | Q | Q | A  | S  | Q | Q | A  | S  |

Table 4 shows another example of a timing scheme, but to increase the time for amplification (A). For lane L1, the time allocated for A (in bold) is F34=F3+F4. In one clock cycle of F34, the rising edge of F34 is the same as F3's rising edge, rs3, and the falling edge of F34 is the same as F4's falling edge, fl4, which is right after rs3. Four extra phases (F34, F41, F12, and F23) may be needed for A of four lanes, respectively. Overlapping reference clock phases for A cannot be applied to the same residue amplifier. Because F34 for lane L1 and F12 for lane L3 are non-overlapping and F41 for lane L2 and F23 for lane L4 are non-overlapping, lanes L1 and L3 may share one residue amplifier RA1, and lanes L2 and L4 may share another residue amplifier RA2. Alternatively, four residue amplifiers RA1, RA2, RA3 and RA4 may be used for lanes L1, L2, L3 and L4, respectively, so that each lane has its own residue amplifier. The residue amplifiers may be powered down when they are not in A operation to save power.

TABLE 4

|    | F1 | F2 | F3 | F4 | F1 | F2 | F3 | F4 | F1 | F2 | F3 | F4 |
|----|----|----|----|----|----|----|----|----|----|----|----|----|
| L1 | S  | Q  | A | A | S  | Q  | A | A | S  | Q  | A | A |
| L2 | A | S  | Q  | A | A | S  | Q  | A | A | S  | Q  | A |
| L3 | A | A | S  | Q  | A | A | S  | Q  | A | A | S  | Q  |
| L4 | Q  | A | A | S  | Q  | A | A | S  | Q  | A | A | S  |

Figure 7:
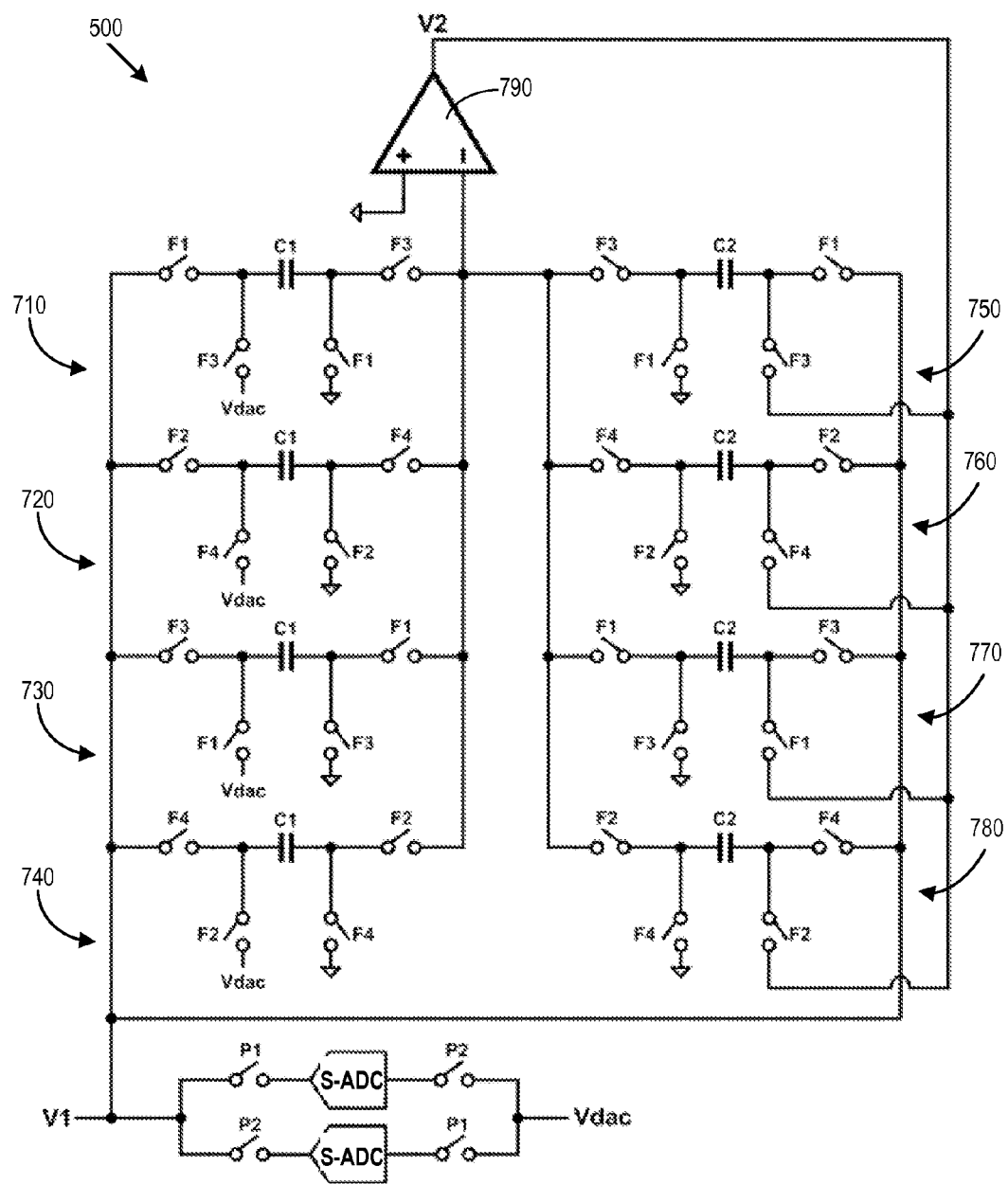
FIG. 7 is a block diagram of an exemplary implementation of the first stage of the ADC of FIG. 5, which provides for the dedicated clock phase for quantization as shown in the reference clock phases (F1-F4) of FIG. 6.

FIG. 7 is a block diagram of an exemplary implementation of the first stage 500 of the ADC of FIG. 5, which provides for the quantization phase delay in the timing as shown in the reference clock phases (F1 through F4) of FIG. 6. FIG. 7 may be implemented within a multiplying DAC (MDAC) circuit.

The first stage 500 may include a switched capacitor network designed with a bank of C1 capacitors on one side and a bank of C2 capacitors on a second side. The bank of C1 capacitors may include four C1 capacitor modules, labeled 710, 720, 730 and 740 respectively in FIG. 7. The bank of C2 capacitors may include four C2 capacitor modules, labeled 750, 760, 770 and 780 in FIG. 7. The functions of each capacitor module may be adapted to shifting of timing of multiple ADC lanes such that the sampled input signals may be held on selected of the C1 and C2 capacitors during quantization, and thus avoid the need to use a SHA sub-stage in the first stage 500. Furthermore, an operational amplifier 790 may be shared across the capacitor modules for residue amplification. The operational amplifier may be engaged by a single ADC lane at a time based on the timing of the assigned reference clock phases as discussed with reference to FIG. 5.

The conventional timing phases such as clock phases P1 and P2 (FIG. 6) may drive switches (P1, P2) connected with the sub-ADCs to generate Vdac. A more detailed explanation of generating Vdac will be given with reference to FIGS. 8 and 9.

The C1 capacitors may be selectively switchable between the input voltage (V1) and a voltage reference (Vdac) on the input sides of the C1 capacitors and between ground and a negative input to an operational amplifier 790 on the output sides of the C1 capacitors. The C2 capacitors may be selectively switchable between an input voltage (V1) and an output of the operational amplifier 690 on the input sides and between the ground and the negative input to the operational amplifier 790 on the output sides of the C2 capacitors. Vdac is generated from the sub-ADC output as will be explained in more detail with reference to FIGS. 8 and 9.

Accordingly, during the F1 clock phase assigned to the sample clock phase, the F1 switches close and charge the top C1 capacitor (in module 710) and the top C2 capacitor (in module 750) in the respective banks of capacitors. During the F2 clock phase assigned to the quantification clock phase, the voltage may be held onto these C1 and C2 capacitors because the F1 and F3 switches are open, and quantization may occur without losing the input voltage value. By clock phase F3, the quantized sub-ADC output, Vdac, may be connected to C1. The residue is the difference between the input and the quantized sub-ADC output, Vdac.

More specifically, during clock phase F3 and assuming that clock phase F3 was assigned to the amplification clock phase, the C2 capacitor is connected between the output of the operational amplifier 790 and the negative input to the operational amplifier 790. The C1 capacitor is connected between the negative input to the operational amplifier 790 and Vdac. This configuration during the F3 phase causes a gain of the operational amplifier of C1/C2.

Figure 8:
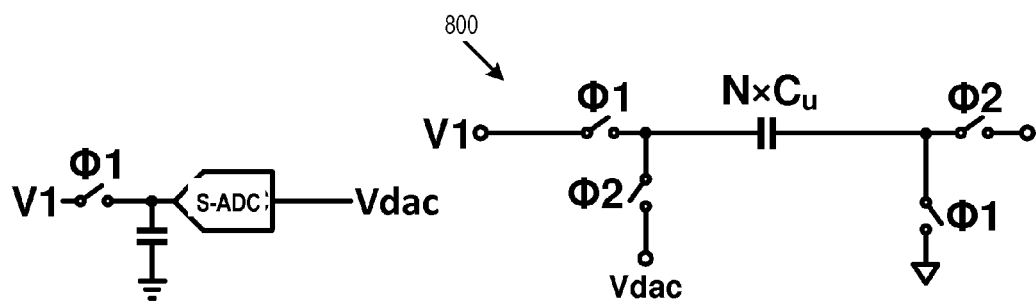
FIG. 8 is a block diagram of an exemplary circuit that implements a sub-ADC output voltage (Vdac) provided to the first stage circuit of FIG. 7.
Figure 9:
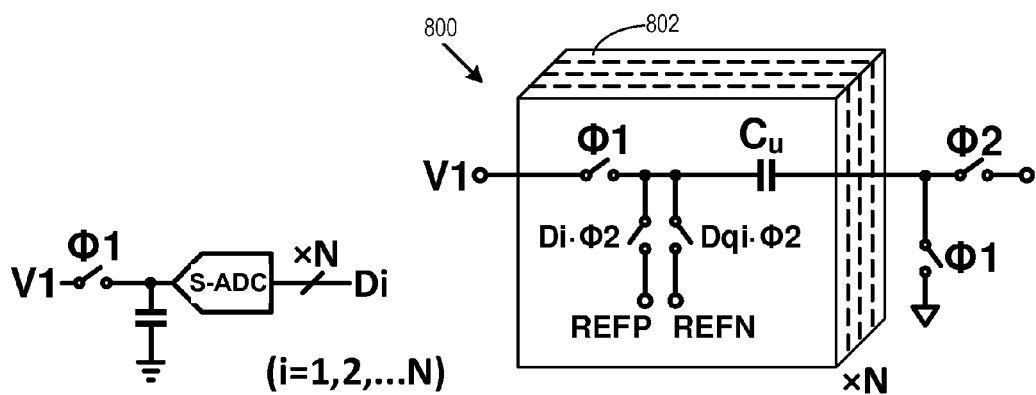
FIG. 9 is a more detailed block diagram of the exemplary circuit of FIG. 8.

FIG. 8 is a block diagram of an exemplary circuit 800 that implements the sub-ADC output voltage (Vdac) provided to the first stage circuit of FIG. 7. FIG. 9 is a more detailed block diagram of the exemplary circuit 800 of FIG. 8, showing generation of the sub-ADC reference voltage, Vdac, in FIG. 8. There may be N units 802, where each unit 802 may include a unit capacitor Cu and phase-driven switches ($\phi1$, $\phi2$). Depending on the sub-ADC output, Di (i=1, 2, ... N), some of the unit capacitors may be connected to REFP (Di×$\phi2$) and some to REFN (Dqi×$\phi2$) during clock phase $\phi2$, where Dqui= $\overline{Di}$. Total capacitance may be equivalent to the addition of all N unit capacitors (N×Cu) which connect to the reference voltage Vdac during clock phase $\phi2$.

Vdac, therefore, may equal REFP when all unit capacitors are connected to REFP during phase $\phi2$. Vdac may equal REFN when all unit capacitors are connected to REFN during phase $\phi2$. Vdac may fall between voltages for REFP and REFN when part of the N unit capacitors are connected to REFP and/or part of the N unit capacitors are connected to REFN. Accordingly, the logic generated by selection of N unit capacitors may be driven by the sub-ADC output, Di, to variably choose positive voltage from REFP and negative voltage from REFN. The combination of voltages for REFN and REFP may then be the sub-ADC output voltage, Vdac, used in the first stage 500 circuit of FIG. 7.

The disclosed, improved pipelined ADC obviates the need for a SHA stage before the first stage of the pipelined architecture of the ADC. The disclosed pipelined ADC may show a doubling of speed or a halving of power dissipation, depending on design choice. For example, the disclosed pipelined ADC may yield at least 106 mW (milliwatts) in power savings in one example circuit, which is about half that consumed by the SHA implementation. Alternatively, for the same power dissipation of the SHA implementation, the speed of the new piplined ADC may be about two times faster. The chip area of the new piplined ADC should be reduced compared to the SHA implementation. The disclosed pipelined ADC may, therefore, facilitate products that incorporate the pipelined ADC in meeting Energy Star and other energy efficiency requirements and improve energy efficiency.

The disclosed pipelined ADC may also see a significant improvement in reduction of noise and distortion performance, particularly due to the elimination of the SHA. Buffer noise may typically be about 88.3 uVrms (micro root mean squared voltage) and SHA tracking noise may typically be about 72 uVrms. Through elimination of the SHA, the disclosed pipelined ADC may eliminate about 72 uVrms SHA noise (from tracking) and 134 uVrms SHA noise (from holding). Total noise after the reduction may be about 160 uVrms, which is almost half of the total noise in a corresponding SHA implementation in one example.

Figure 10:
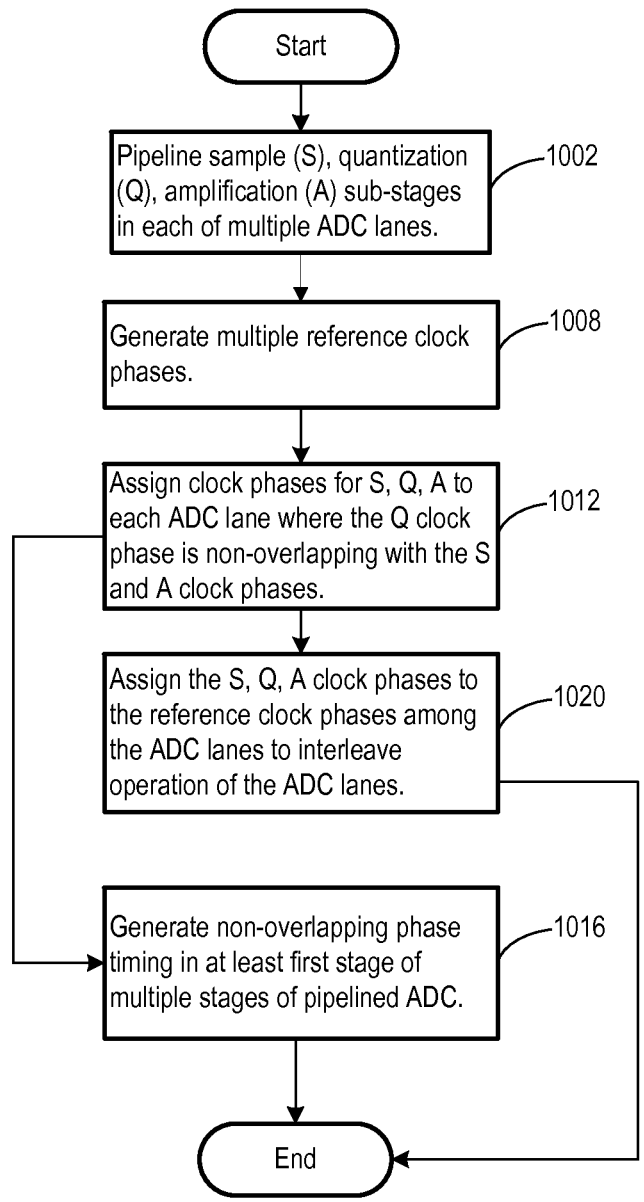
FIG. 10 is a flow diagram of logic for a method of interleaving phased operation of a pipelined ADC.

FIG. 10 is a flow diagram of logic for a method of interleaving phased operation of a pipelined ADC. The method may include pipelining a sample sub-stage, a quantization sub-stage, and an amplification sub-stage in each of multiple ADC lanes (1002). The method may generate multiple reference clock phases for the sample sub-stages, quantization sub-stages, and amplification sub-stages in the multiple ADC lanes (1008). The method may further assign clock phases to the ADC lane, the clock phases including a sample clock phase, a quantization clock phase, and an amplification clock phase, and in which the quantization clock phase is non-overlapping with the sample clock phase and the amplification clock phase (1012).

The method of FIG. 10 may further include generating the non-overlapping phase timing in at least a first stage of multiple stages of the pipelined ADC (1016). The method may further assign the sample clock phase, quantization clock phase, and amplification clock phase to the reference clock phases among the ADC lanes in a manner that interleaves operation of the ADC lanes (1020).

The methods, devices, and logic described above may be implemented in many different ways in many different combinations of hardware, software or both hardware and software. For example, all or parts of the system may include circuitry in a controller, a microprocessor, or an application specific integrated circuit (ASIC), or may be implemented with discrete logic or components, or a combination of other types of analog or digital circuitry, combined on a single integrated circuit or distributed among multiple integrated circuits.

While various embodiments of the invention have been described, it will be apparent to those of ordinary skill in the art that many more embodiments and implementations are possible within the scope of the invention. Accordingly, the invention is not to be restricted except in light of the attached claims and their equivalents.

What is claimed is:

1. A method comprising:
   pipelining a sample sub-stage, a quantization sub-stage, and an amplification sub-stage in an analog-to-digital converter (ADC) lane of an ADC; and
   assigning clock phases to the ADC lane, the clock phases comprising a sample clock phase, a quantization clock phase, and an amplification clock phase, and in which the quantization clock phase is non-overlapping with the sample clock phase and the amplification clock phase.

2. The method of claim 1, further comprising:
   generating a first, second, third, and fourth reference clock phase; and
   assigning the sample clock phase, quantization clock phase, and amplification clock phase to at least three of the first, second, third, and fourth clock phases.

3. The method of claim 1, where the ADC lane is one of multiple ADC lanes in the ADC, each ADC lane comprising a sample sub-stage, quantization sub-stage, and an amplification sub-stage; and further comprising:
   generating reference clock phases for the sample sub-stages, quantization sub-stages, and amplification sub-stages in the multiple ADC lanes; and
   assigning the sample clock phase, quantization clock phase, and amplification clock phase to the reference clock phases among the ADC lanes in a manner that interleaves operation of the ADC lanes.

4. The method of claim 3, where the multiple ADC lanes comprise first, second and third ADC lanes.

5. The method of claim 4, where the interleaved operation of the ADC lanes causes the ADC to:

during a first reference clock phase, execute the sample sub-stage in the first ADC lane; the amplification sub-stage in the second ADC lane; and the quantization sub-stage in the third ADC lane;

during a second reference clock phase, execute the quantization sub-stage in the first ADC lane; the sample sub-stage in the second ADC lane; and the amplification sub-stage in the third ADC lane; and during a third reference clock phase, execute the amplification sub-stage in the first ADC lane; the quantization sub-stage in the second ADC lane; and the sample sub-stage in the third ADC lane.

6. The method of claim 3, where the multiple ADC lanes comprise first, second, third and fourth ADC lanes.

7. The method of claim 6, where the interleaved operation of the ADC lanes causes the ADC to:

during a first reference clock phase, execute the sample sub-stage in the first ADC lane; the amplification sub-stage in the third ADC lane; and the quantization sub-stage in the fourth ADC lane;

during a second reference clock phase, execute the quantization sub-stage in the first ADC lane; the sample sub-stage in the second ADC lane; and the amplification sub-stage in the fourth ADC lane;

during a third reference clock phase, execute the amplification sub-stage in the first ADC lane; the quantization sub-stage in the second ADC lane; and the sample sub-stage in the third ADC lane; and during a fourth reference clock phase, execute the amplification sub-stage in the second ADC lane; the quantization sub-stage in the third ADC lane; and the sample sub-stage in the fourth ADC lane.

8. The method of claim 3, further comprising sharing an amplifier across the multiple lanes in a time-interleaved way for the amplification sub-stage so that only one lane engages the amplifier during any given reference clock phase.

9. A pipelined analog-to-digital converter (ADC) comprising:

multiple ADC lanes each comprising a sample sub-stage, a quantization sub-stage, and an amplification sub-stage pipelined together, the multiple ADC lanes located within a first stage of the pipelined ADC; and a phase clock generator configured to assign clock phases to each ADC lane, the clock phases comprising a sample clock phase, a quantization clock phase, and an amplification clock phase, and in which the quantization clock phase is non-overlapping with the sample clock phase and the amplification clock phase.

10. The pipelined ADC of claim 9, where the phase clock generator is further configured to:

generate a first, second, third and fourth reference phase; and assign the sample clock phase, quantization clock phase, and amplification clock phase to at least three of the first, second, third, and fourth clock phases.

11. The pipelined ADC of claim 9, where the phase clock generator is further configured to:

generate reference clock phases for the sample sub-stages, quantization sub-stages, and amplification sub-stages in the multiple ADC lanes; and assign the sample clock phase, quantization clock phase, and amplification clock phase to the reference clock phases among the ADC lanes in a manner that interleaves operation of the ADC lanes.

12. The pipelined ADC of claim 11, where the multiple ADC lanes comprise first, second and third ADC lanes.

13. The pipelined ADC of claim 12, where in response to the interleaved operation of the phase clock generator, the ADC is configured to:

during a first reference clock phase, execute the sample sub-stage in the first ADC lane; the amplification sub-stage in the second ADC lane; and the quantization sub-stage in the third ADC lane;

during a second reference clock phase, execute the quantization sub-stage in the first ADC lane; the sample sub-stage in the second ADC lane; and the amplification sub-stage in the third ADC lane; and during a third reference clock phase, execute the amplification sub-stage in the first ADC lane; the quantization sub-stage in the second ADC lane; and the sample sub-stage in the third ADC lane.

14. The pipelined ADC of claim 11, where the multiple ADC lanes comprise first, second, third and fourth ADC lanes.

15. The pipelined ADC of claim 14, where in response to the interleaved operation of the phase clock generator, the ADC is configured to:

during a first reference clock phase, execute the sample sub-stage in the first ADC lane; the amplification sub-stage in the third ADC lane; and the quantization sub-stage in the third and fourth ADC lanes;

during a second reference clock phase, execute the quantization sub-stage in the first and fourth ADC lanes; the sample sub-stage in the second ADC lane; and the amplification sub-stage in the fourth ADC lane;

during a third reference clock phase, execute the amplification sub-stage in the first ADC lane; the quantization sub-stage in the first and second ADC lanes; and the sample sub-stage in the third ADC lane; and during a fourth reference clock phase, execute the amplification sub-stage in the second ADC lane; the quantization sub-stage in the second and third ADC lanes; and the sample sub-stage in the fourth ADC lane.

16. The pipelined ADC of claim 11, further comprising a shared amplifier executed by the amplifier sub-stages in a time-interleaved way so that only one lane engages the amplifier at any moment in time.

17. A pipelined analog-to-digital converter (ADC) comprising:

a first, second and third ADC lane, each comprising a sample sub-stage, a quantization sub-stage, and an amplification sub-stage pipelined together;

a phase clock generator configured to:

assign clock phases to each ADC lane, the clock phases comprising a sample clock phase, a quantization clock phase, and an amplification clock phase, where the quantization clock phase is non-overlapping with the sample clock and the amplification clock phases;

generate reference clock phases for the sample sub-stages, quantization sub-stages, and amplification sub-stages in the multiple ADC lanes; and assign the sample clock phase, quantization clock phase, and amplification clock phase to the reference clock phases among the ADC lanes in a manner that interleaves operation of the ADC lanes.

18. The pipelined ADC of claim 17, where in response to the interleaved assignment of the sample clock phase, the quantization clock phase and the amplification clock phase to the reference clock phases, the ADC is configured to continuously shift operation of each sub-stage to subsequent reference clock phases in a next sequential ADC lane of the first, second and third ADC lanes.

19. The pipelined ADC of claim 17, where in response to the interleaved operation of the phase clock generator, the ADC is configured to:
- during a first reference clock phase, execute the sample sub-stage in the first ADC lane; the amplification sub-stage in the second ADC lane; and the quantization sub-stage in the third ADC lane;
- during a second reference clock phase, execute the quantization sub-stage in the first ADC lane; the sample sub-stage in the second ADC lane; and the amplification sub-stage in the third ADC lane; and
- during a third reference clock phase, execute the amplification sub-stage in the first ADC lane; the quantization sub-stage in the second ADC lane; and the sample sub-stage in the third ADC lane.

20. The pipelined ADC of claim 17, further comprising a fourth ADC lane, where the amplification sub-stage includes two residue amplifiers, a first residue amplifier shared between the first and third lanes and a second residue amplifier shared between the second and fourth lanes, where in response to the interleaved operation of the phase clock generator, the ADC is configured to:
- during a first reference clock phase, execute the sample sub-stage in the first ADC lane; the amplification sub-stage in the second and third ADC lanes; and the quantization sub-stage in the fourth ADC lane;
- during a second reference clock phase, execute the quantization sub-stage in the first ADC lane; the sample sub-stage in the second ADC lane; and the amplification sub-stage in the third and fourth ADC lanes;
- during a third reference clock phase, execute the amplification sub-stage in the first and fourth ADC lanes; the quantization sub-stage in the second ADC lane; and the sample sub-stage in the third ADC lane; and
- during a fourth reference clock phase, execute the amplification sub-stage in the first and second ADC lanes; the quantization sub-stage in the third ADC lane; and the sample sub-stage in the fourth ADC lane.

* * * * *